(12) United States Patent  (10) Patent No.: US 6,492,831 B2
Hashimoto                  (45) Date of Patent:    Dec. 10, 2002

(54) CURRENT MEASURING METHOD AND CURRENT MEASURING APPARATUS

(75) Inventor: Yoshihiro Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/905,026

(22) Filed: Jul. 13, 2001

(65) Prior Publication Data

US 2002/0041190 A1 Apr. 11, 2002

Related U.S. Application Data

(63) Continuation-in-part of application No. 09/451,937, filed on Dec. 1, 1999, now abandoned.

(30) Foreign Application Priority Data

Dec. 2, 1998 (JP) .............................................. 10-343427

(51) Int. Cl.[7] .............................................. G01R 31/26
(52) U.S. Cl. ..................................................... 324/765
(58) Field of Search ................................ 324/763, 765, 324/158.1; 714/733, 734

(56) References Cited

U.S. PATENT DOCUMENTS 3,772,470 A  * 11/1973 Cowpland et al. ........ 179/84 T
5,594,359 A  *  1/1997 Hashimoto ................. 324/765

* cited by examiner

*Primary Examiner*—Christine K. Oda
*Assistant Examiner*—Etienne P LeRoux
(74) *Attorney, Agent, or Firm*—Rosenthal & Osha, L.L.P.

(57) ABSTRACT

A current measuring method, which measures a device current flowing through a terminal of a semiconductor device including charging the capacitor which is connected between the terminal and an earth potential of the semiconductor device, up to a predetermined voltage; setting the semiconductor device to be in active sate by applying a test pattern to the semiconductor device; measuring a potential of the capacitor at the terminal side after a predetermined test time has elapsed; and judging whether the device current is within a predetermined allowable range, based on the test time, capacitance of the capacitor, and the potential.

19 Claims, 10 Drawing Sheets (A)

(B)

CURRENT MEASURING METHOD AND CURRENT MEASURING APPARATUS

This patent application is a continuation-in-part patent application from the U.S. patent application Ser. No. 09/451,937 filed on Dec. 1, 1999, now abandoned. This patent application claims priority based on Japanese patent application, H10-343427 filed on Dec. 2, 1998, and the U.S. patent application Ser. No. 09/451,937, the contents of which are incorporated herein by reference.

BACKGROUND OF THE INVENTION

1. Field of the Invention

The present invention relates to a current measuring method and a current measuring apparatus for measuring the current generated in a terminal of a semiconductor device. In particular, the present invention relates to a current measuring method and a current measuring apparatus which can at high speed, accurately measure the power supply current generated in the power supply terminal of the semiconductor device.

2. Description of the Related Art

Recently, through the improvement of CMOS technology, a highly integrated semiconductor device with low power consumption has become apparent. High-speed operation elements such as a microcomputer, a memory, and a DSP, can be integrated into the semiconductor device, for example, a system LSI. In this kind of semiconductor device, the power supply current is usually measured when the CMOS IC is not operating. However, a large surge of power flows into the CMOS IC when the CMOS IC operates. The operation of various kinds of circuits inside the chip of such a system LSI can be very complex at high speed, causing the current to increase during the operation. The fluctuation of the voltage in the power supply terminal then increases, thus increasing the possibility of a malfunction of the device.

Furthermore, in the case of a device, which is operated by battery, the life of the battery decreases if the surge of current during operation is large. It is therefore necessary to measure the current including the surge of current during the operation, for a fixed period of time.

FIG. 1 shows a block diagram of a conventional current measuring method. A power supply (VS) 10, which provides voltage to a device (DUT) 20, must provide the desired voltage very accurately. Therefore, a negative feedback type voltage source is generally used for the power supply 10. However, there is a limit in response speed of current supply of the negative feedback voltage source. When the change in the power supply current $I_{DUT}$ is large and fast, the power supply (VS) 10 cannot respond. Therefore, a bypass capacitor $C_L$, which is usually located near the DUT 20, provides a current $I_{CL1}$ to the DUT 20.

FIG. 2 shows a diagram explaining the principle of a current measuring method. If the power supply output Vo changes, the negative feedback provided in the power supply 10 functions, and a current $I_{PS}$ is provided from the power supply 10. Therefore, the current discharged from the bypass capacitor $C_L$ is charged with the current $I_{PS}$. If the period from the start of a cycle of consumption of the DUT 20 power supply current to the next cycle of consumption of the power supply current, is long, the $I_{PS}$ becomes $I_{PS}$ (ty)=0 during that period. Therefore, "the integrated value of the power supply current=X1" and "the integrated value of the current ($I_{PS}$) provided from the power supply=X2" becomes equal in each cycle. Thus, by measuring the current ($I_{PS}$) provided by the power supply 10, the current consumed by the DUT 20 can be measured for each cycle.

However, if the cycle of the change of the power supply current ($I_{DUT}$) is short, the $I_{PS}$ cannot become "$I_{PS}$ (ty)=0". The influence of the previous measuring cycle remains in the form of residual current and overlapping consumption cycles, so the current of the device DUT cannot be measured accurately by just measuring the current ($I_{PS}$) provided from the power supply.

FIG. 3 shows another block diagram of a conventional current measuring method. To solve the problems outlined above, a current-voltage converter L2 is provided between the power supply (VS) 10 and the power supply terminal of the DUT 20, so that the power supply current $I_{DUT}$ can be measured directly. An example of apparatus suitable for this kind of measurement is the Current Transformer (CT-1) (Trademark) of Sony/Tektronix Corporation (Trademark). However, the size of the general current-voltage converter 12 is large, as the current-voltage converter 12 has to be located in a position away from the DUT 20 when testing a wafer form DUT. Therefore, the distance between the current-voltage converter 12 and the bypass capacitor $C_L$ is large. The result is, if the change of the power supply current is large, the bypass capacitor $C_L$ cannot provide the current instantaneously. Then, a large fluctuation in the voltage Vo' of the power supply terminal occurs, thus causing the malfunction of the DUT 20. Also, to calculate the integrated value of the power supply current, a means of integrating the voltage $V_M$ is needed.

SUMMARY OF THE INVENTION

Therefore, it is an object of the present invention to provide a current measuring method and a current measuring apparatus which overcome the above issues in the related art. This object is achieved by combinations described in the independent claims. The dependent claims define further advantageous and exemplary combinations of the present invention.

According to the first aspect of the present invention, a current measuring method, which measures a device current flowing through a terminal of a semiconductor device, can be provided. The current measuring method comprises charging the capacitor which is connected between the terminal and an earth potential of the semiconductor device, up to a predetermined voltage; setting the semiconductor device to be in active sate by applying a test pattern to the semiconductor device; measuring a potential of the capacitor at the terminal side after Et predetermined test time has elapsed; and judging whether the device current is within a predetermined allowable range, based on the test time, capacitance of the capacitor, and-the potential.

A current measuring method can be provided which further comprises steps of initializing the capacitor to a predetermined voltage; providing a predetermined current to the capacitor; measuring the change of potential of the capacitor at the terminal side of said semiconductor device after a predetermined time has elapsed; and calculating out the capacity of the capacitor based on the predetermined current, the predetermined time, and the change of potential.

A current measuring method can be provided which further comprises steps of initializing the capacitor to a predetermined voltage; providing a predetermined current to the capacitor; measuring the time taken until the potential of the capacitor at the terminal side of said semiconductor device reaches a predetermined change of potential; and calculating out the capacitance of the capacitor based on the predetermined current, the time, and the change of potential. The predetermined current is a known constant current. The predetermined current providing step may provide a known constant voltage to the capacitor through a known resistance.

A current measuring method can be provided which further comprises steps of calculating out the allowable range of potential after a test time has elapsed based on the largest current allowed into the terminal and the capacitance of the capacitor; and judging that the semiconductor device is defective when the calculated potential is out of the allowable range.

A current measuring method can be provided which further comprises a step of supplementing the terminal with a supplementary current, which supplements the device current when the potential of the terminal is lower than a predetermined value. The supplementary current is generated by a constant-voltage power supply, and supplied to the terminal through a diode.

According to the second aspect of the present invention, a current measuring apparatus, which measures a device current flowing through a terminal of a semiconductor device, can be provided. The current measuring apparatus comprises a capacitor connected between the terminal and an earth potential of the semiconductor device; a driver which charges the capacitor up to a predetermined voltage; a pattern generator which operates the semiconductor device; a comparator which measures the potential of the capacitor at the terminal side after a predetermined test time has elapsed; and a means of calculating out the device current based on the test time, the capacitance of the capacitor, and the potential.

A current measuring apparatus can be provided which further comprises a dummy load circuit providing a predetermined current to the capacitor after setting the capacitor to a predetermined voltage; and a means of calculating out the capacitance of the capacitor. This calculation is based on the potential at the terminal side, measured by the comparator after provision of the predetermined current to the capacitor by the dummy load circuit for a predetermined time, and the predetermined current. The dummy load circuit may provide a known constant current to the capacitor. The dummy load circuit may also provide a known constant voltage to the capacitor through a known resistance.

A current measuring apparatus can be provided which further comprises a means of calculating out the allowable range of the potential after the test time has elapsed based on the largest current allowed into the terminal and the capacitance of the capacitor; and a means of judging that the semiconductor device is defective when the potential is out of the allowable range.

A current measuring apparatus can be provided which further comprises a power supply that provides a supplementary current (which supplement the device current), to the terminal when the potential of the terminal is smaller than a predetermined value. A current measuring apparatus may further comprise a diode which connects the power supply and the terminal.

This summary of the invention does not necessarily describe all necessary features. The invention may also be a sub-combination of these described features.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
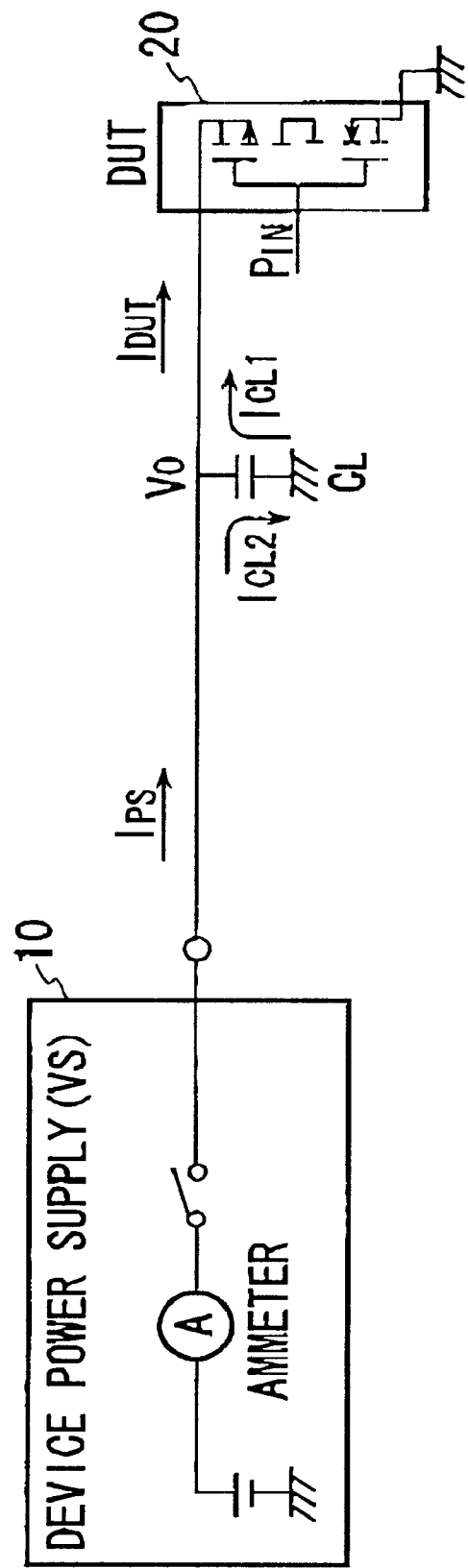
FIG. 1 shows a block diagram of a conventional current measuring method.
Figure 2:
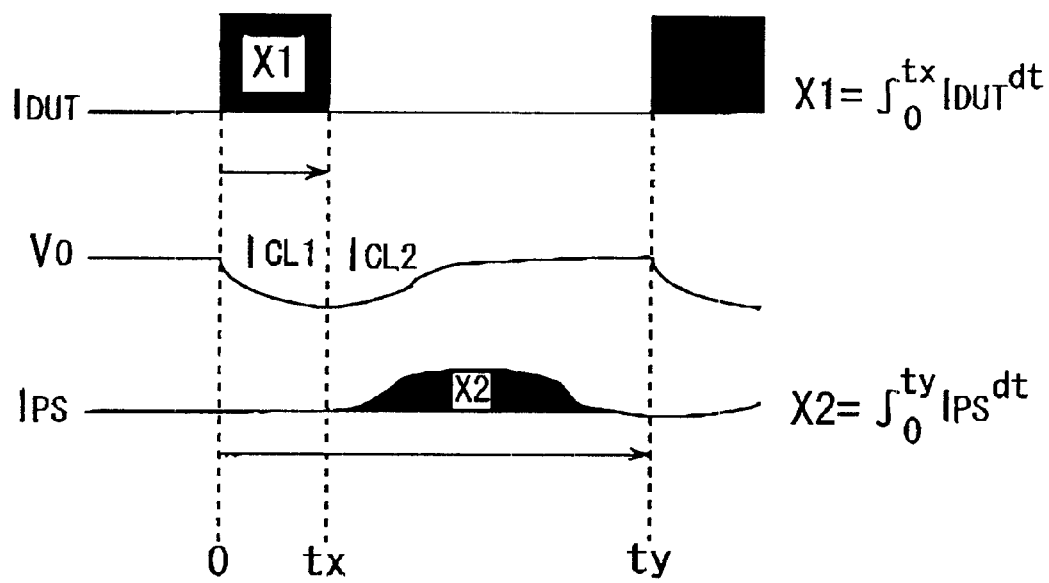
FIG. 2 shows a diagram illustrating the principle of the current measuring method.
Figure 3:
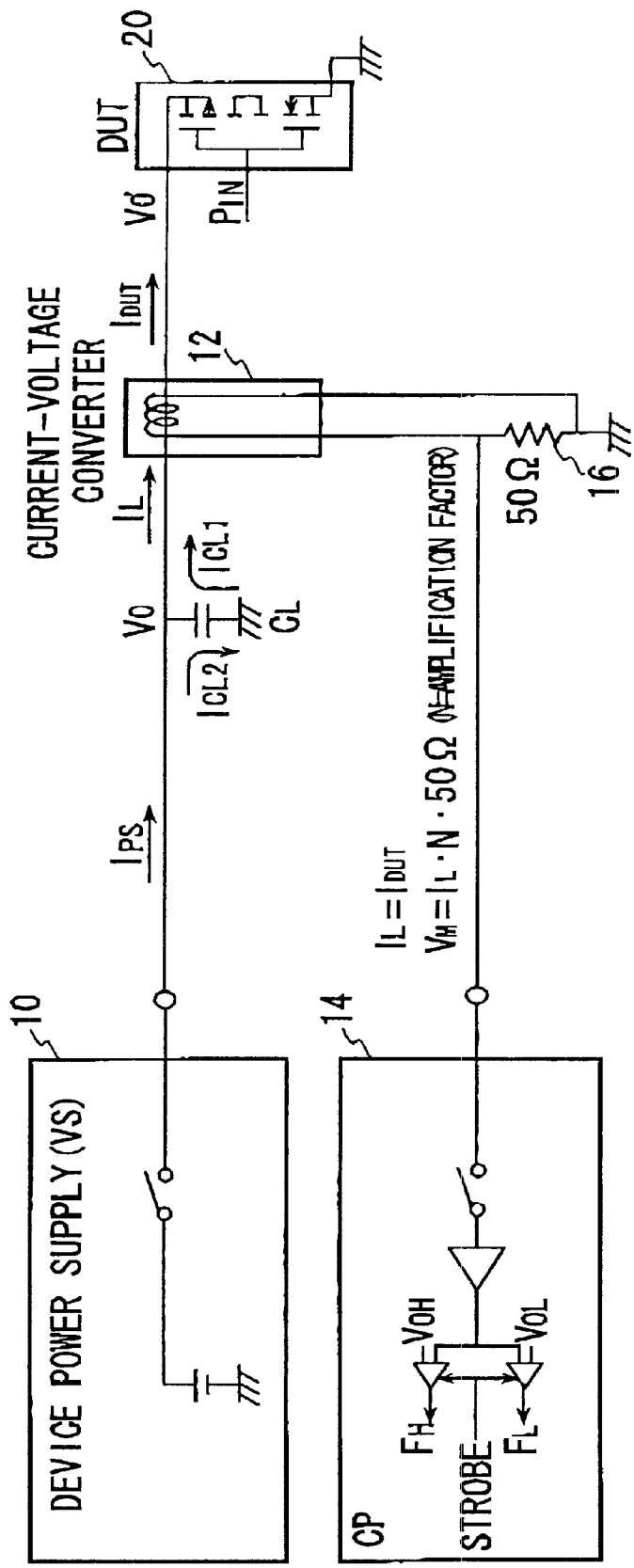
FIG. 3 shows another block diagram of the conventional current measuring method.
Figure 4:
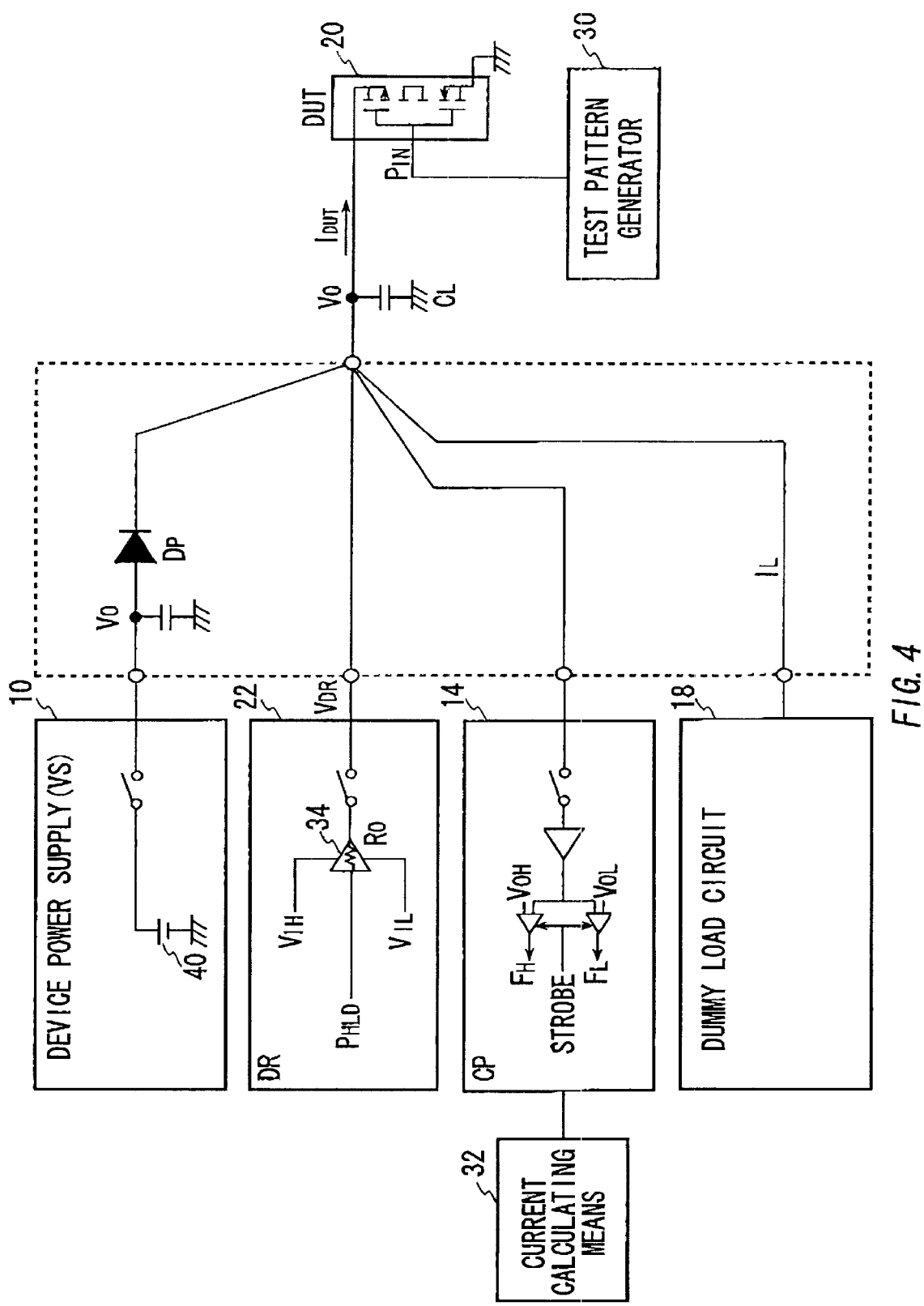
FIG. 4 shows a block diagram of a current measuring apparatus according to the present embodiment.

FIG. 4 shows a block diagram of a current measuring apparatus according to the present invention. The current measuring apparatus measures a device current generated in the terminal of a device under test (DUT) 20 such as a semiconductor device. A capacitor CL is provided between the terminal of the DUT and the earth potential of the semiconductor device. The current measuring apparatus has a driver DR22, a pattern generator 30, a comparator CP14, and a current calculating means 32. The driver 22 charges the capacitor $C_L$ to a predetermined voltage. The pattern generator 30 generates a test pattern for operating the DUT 20. The comparator CP14 measures the potential of the capacitor $C_L$ at the terminal side after a predetermined test time t has elapsed. The current calculating means 32 calculates the device current $I_{DUT}$ based on the test time t, the capacitance of capacitor $C_L$, and the potential measured by the comparator CP14.

The driver 22 serves as a voltage source that provides high or low voltages to the DUT 20. The driver 22 varies the voltage at high speed between the states of high, low, or high impedance. If the interior resistance of the driver DR22 is Ro, the charging curve for charging the capacitor $C_L$ can be determined by the time constant $\tau_X = Ro \times C_L$. The comparator CP14 measures whether or not the input voltage, when the STROBE signal is input, is smaller than $V_{OH}$ and larger than $V_{OL}$. By repeating the measurement of the voltage, and adjusting the setting voltage $V_{OH}$ and $V_{OL}$ closer to the value of the input voltage with every measurement, the voltage of the measuring terminal of the DUT 20 can be measured accurately and at high speed.

Figure 5:
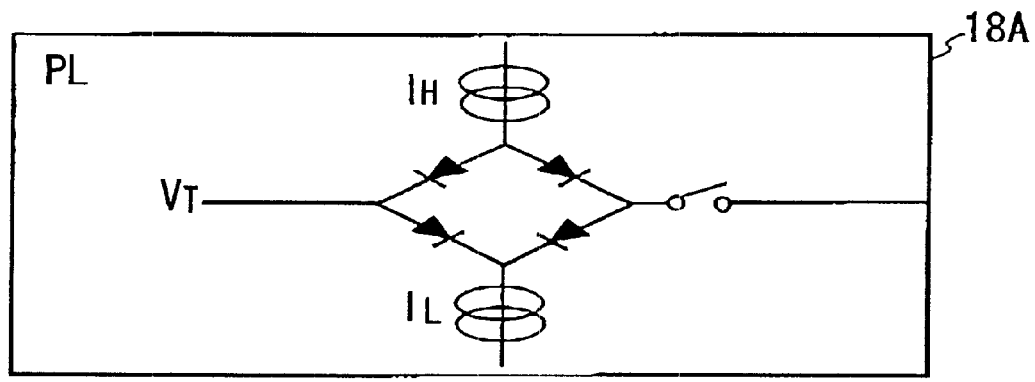
FIG. 5 shows a detailed configuration of a dummy load circuit 18.
Figure 5:
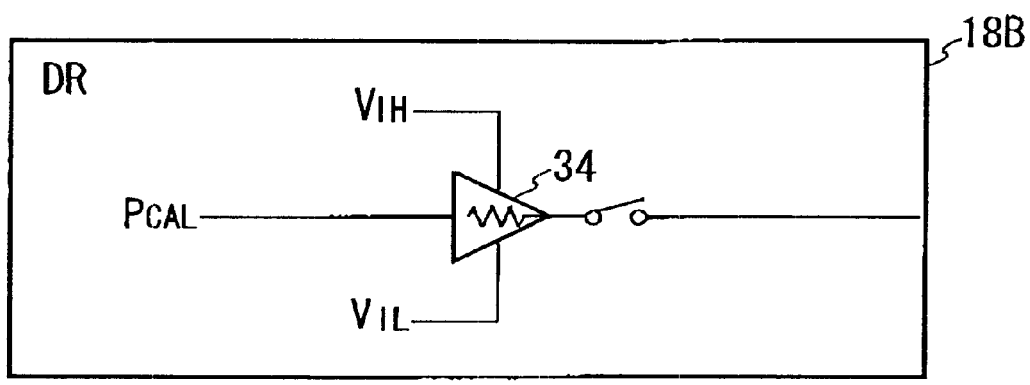

FIG. 5 (A) and (B) show examples of a dummy load circuit 18. As shown in the FIG. 5 (A), a constant current circuit 18A serving as the dummy load circuit 18 may be formed using a diode bridge. The constant current circuit 18A provides a constant current to the DUT. As shown in FIG. 5(B), a driver 18B serving as the dummy load circuit 18 has a comparator 34. The control input voltage of the comparator 34, which has a predetermined interior resistance, maybe controlled to be slightly smaller than the voltage charged in the capacitor $C_L$. By doing this, a current with a magnitude calculated by dividing the difference between the potential of the capacitor $C_L$ at the terminal side and the control input potential of the driver 34 by the interior resistance, can be generated.

Figure 6:
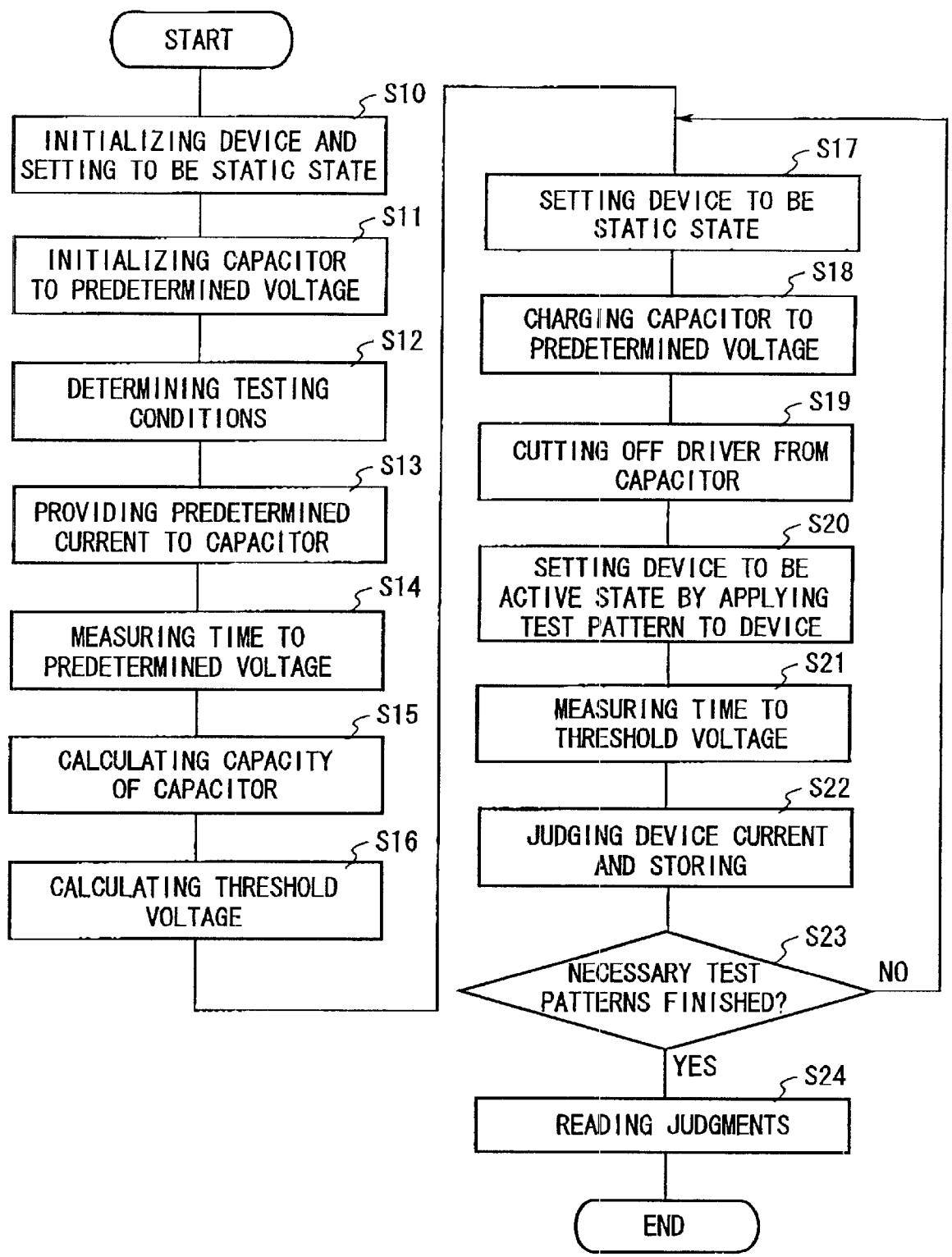
FIG. 6 shows the current measuring method of the present embodiment.

FIG. 6 shows a flow chart illustrating the operation of measurement a current generated in the terminal of the DUT using the current measuring apparatus of the present embodiment of the invention. First, the DUT 20 is initialized, and the DUT 20 is set to be static state (S10). The capacitor $C_L$ is initialized to a predetermined voltage Vini by, in this embodiment, charging with the driver DR22 (S11). At this time, because the other terminal of the capacitor $C_L$ is connected to earth, the potential of the terminal of the DUT 20 side becomes Vini. Next, testing conditions for calculating the capacitance of the capacitor $C_L$, that is, a measuring interval $t_{int}$ and a current $I_L$ provided to the capacitor $C_L$ are determined (S12).

Furthermore, the predetermined current $I_L$ is provided to the capacitor $C_L$ (S13). The potential Vo (changing potential) of the capacitor $C_L$ at the DUT terminal side is measured after a predetermined time $t_{cal}$ serving as a first test time has elapsed (S14). This measuring step S14 will be described in more detail below. The capacitance of the capacitor $C_L$ is calculated based on the predetermined current $I_L$ provided to the capacitor $C_L$, the predetermined first test time $t_{cal}$, and the changing potential Vo (S15).

If the terminal to be measured is a power supply pin that provides a positive power supply to the DUT 20, it is preferable that the voltage charged in the capacitor is a positive power supply voltage. Furthermore, it is preferable that the predetermined current $I_L$ is a current that flows in the direction required for discharge of the capacitor $C_L$. This predetermined current $I_L$ can be a known constant current, or a current generated by providing a known constant voltage to the capacitor $C_L$ through a known resistance. The threshold voltage $V_{OHS}$ of the capacitor $C_L$ is calculated such that an electric charge amount is divided by the capacitance of the capacitor $C_L$, assuming that the largest current being permissive flows into the terminal of the capacitor $C_L$ for a predetermined time tx serving as a second test time(S16).

Next, under the condition that the DUT 20 is maintained in the static state (S17), the capacitor $C_L$ is charged to a predetermined voltage by the driver DR22 again at the condition in which the DUT 20 is stopped (S18). In the step S17 the static state may be a standby state which is ready for being in active state in order to obtain high speed sensitivity. When charging is finished, the driver DR22 is cut off from the capacitor $C_L$ (S19). Then, a test pattern is provided to the DUT 20 to set the DUT 20 to be in the active state (S20). The potential Vt of the capacitor $C_L$ at the DUT terminal side is measured after the second test time tx has elapsed (S21). Based on the measured potential Vt, the current of the DUT 20 is judged such that, if the measured potential Vt exceeds the allowable potential threshold value $V_{OHS}$, the DUT 20 is judged as defective (S22).

Namely, in case where the measured potential Vt exceeds the threshold value $V_{OHS}$, it is recognized that the current flowing into the DUT 20 stands outside the allowable range, so that it can be found that this DUT 20 is defective. On the contrary, in case where the measured potential Vt does not exceed the threshold value $V_{OHS}$, it is recognized that the current to the DUT 20 stays within the allowable range, so that it can be found that this DUT 20 has fair quality.

The judgements are written into a memory, not shown in the figure, (S22). The steps from S17 to S23 are repeated until all necessary test patterns are provided to the DUT 20. When testing of all the test patterns is finished (S23), judgments are read from the memory, then the test is terminated (S24).

There is a possibility that a spike current may be generated when the charging of the capacitor $C_L$ is started or finished by the driver DR22. Therefore, it is also preferable to provide a power supply (VS) 10 to supplement the device current when the potential in the measurement terminal becomes lower than a predetermined value. The power supply 10 provides supplementary current to the terminal from a constant-voltage power supply 40 through a diode Dp. When the potential Vo of the measurement terminal becomes smaller than the potential (obtained by subtracting the potential decrease produced by the diode Dp from the voltage generated by the constant-voltage power supply 40), the supplementary current is provided from the power supply 10 to the DUT 20.

Figure 7:
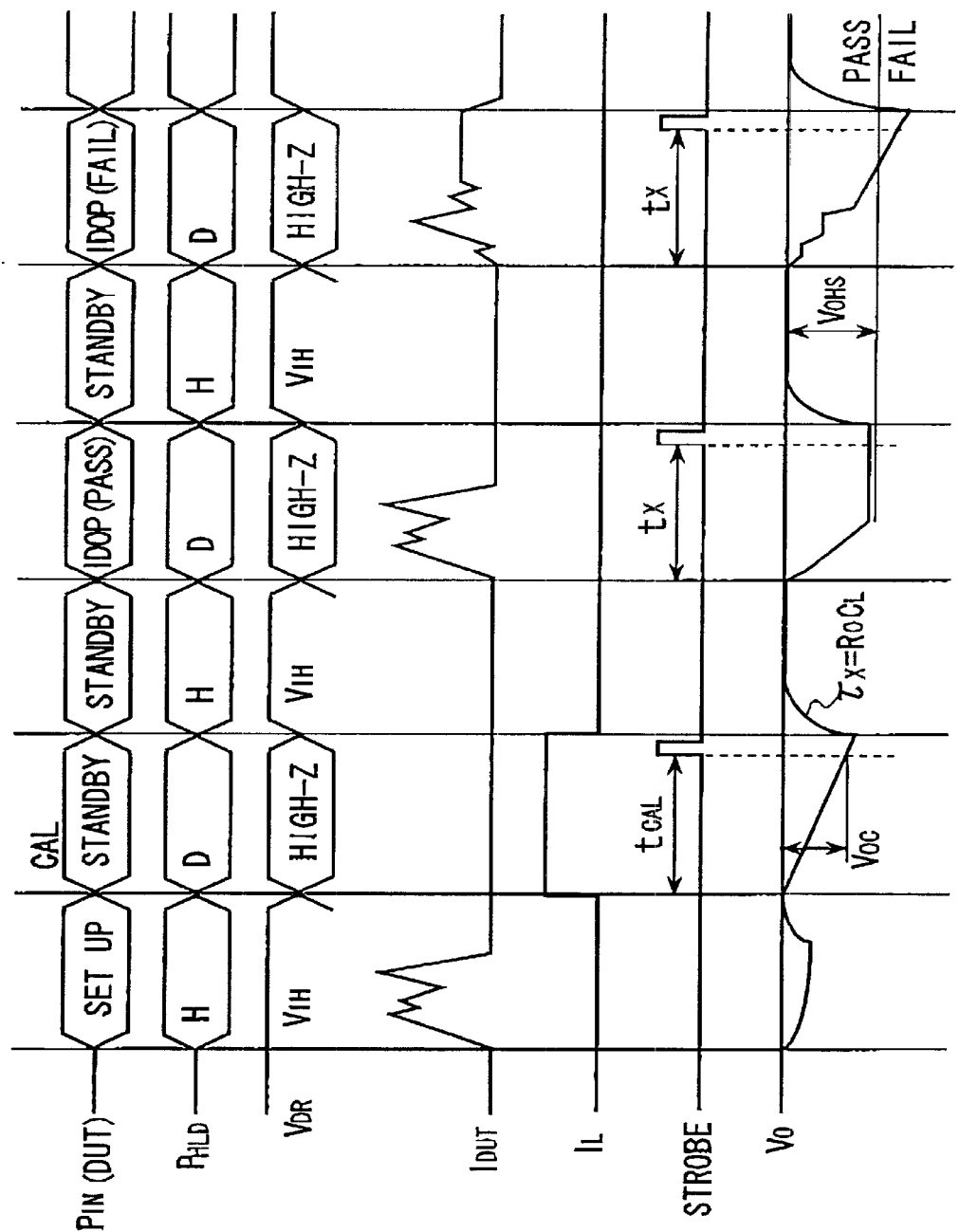
FIG. 7 shows a sequence diagram illustrating the sequence of the current measuring method of the present embodiment.

FIG. 7 shows a sequence diagram of an operation of the current measuring apparatus when using the dummy load circuit 18A shown in FIG. 5(A). In FIG. 7, a driving signal PIN which drives the DUT 20 is provided from the pattern generator 30. A driving signal $P_{HLD}$ drives the driver DR22. An output VDR is output from the driver DR22. A current $I_{DUT}$ is provided from the power supply terminal to the DUT 20 when the DUT 20 operates, i.e. is in the active state. Indeed, the current IDU may not be measured directly. However, for the purpose of explanation, the current $I_{DUT}$ is represented in FIG. 5(A). A current $I_L$ flows from the capacitor $C_L$ to the dummy load circuit 18 when the dummy load circuit 18 is connected to the capacitor $C_L$. A strobe signal STROBE makes the voltage of the power supply terminal be input to the comparator 14. A voltage Vo is generated at the power supply terminal, that is, a voltage Vo of the capacitor $C_L$ at the power supply terminal side.

For example, if $C_L$=0.1 uF, and the calibration condition iS $I_L$=20 mA, $t_{CAL}$=500 ns, then the terminal voltage changes only 100 mV because Voc=(20 mA×500 ns)/0.1 uF=100 mV. Therefore, the terminal voltage changes at the speed of 100 mV/500 nS=5 mV/25 nS. Thus, in the step S14 if the terminal voltage Vo is sampled every measuring intervals $t_{int}$=25 nS by the comparator 14, and the time when the output of the comparator CP14 alternates is detected, the terminal voltage Vo can be measured to an accuracy of within 5 mV. Because the capacitance of the capacitor $C_L$ may includes some error, the capacitance of the capacitor $C_L$ is calculated again using the measured terminal voltage Vo. For example, if the judging value $V_{OH}$ in the comparator CP14 is set as 100 mV, the value $C_L$ can be calculated to an accuracy of 5 mV/100 mV=5%. If the error of the $C_L$ is larger than this, the range of the first test tirre $t_{CAL}$ would preferably be broadened.

Based on the calculated value of $C_L$, the threshold value $V_{OHS}$ is set which is used for judging the power supply current of the DUT 20. If the average power supply current to the DUT 20 in the active state is $I_{DUTn}$=50 mA over a time period as the second test time tx=20 nS, the magnitude of the voltage decrease of the capacitor $C_L$ after 20 nS is:

$$V_{OHS} = I_{DUTn} \times tx / C_L = (50 \text{ mA} \times 20 \text{ nS}) / 0.1 \text{ uF} = 10 \text{ mV}$$

If the voltage decrease of the capacitor $C_L$ during the testing is larger than the value obtained by multiplying a predetermined margin by the value $V_{OHS}$ obtained above, it can be judged that the DUT 20 is defective.

Figure 8:
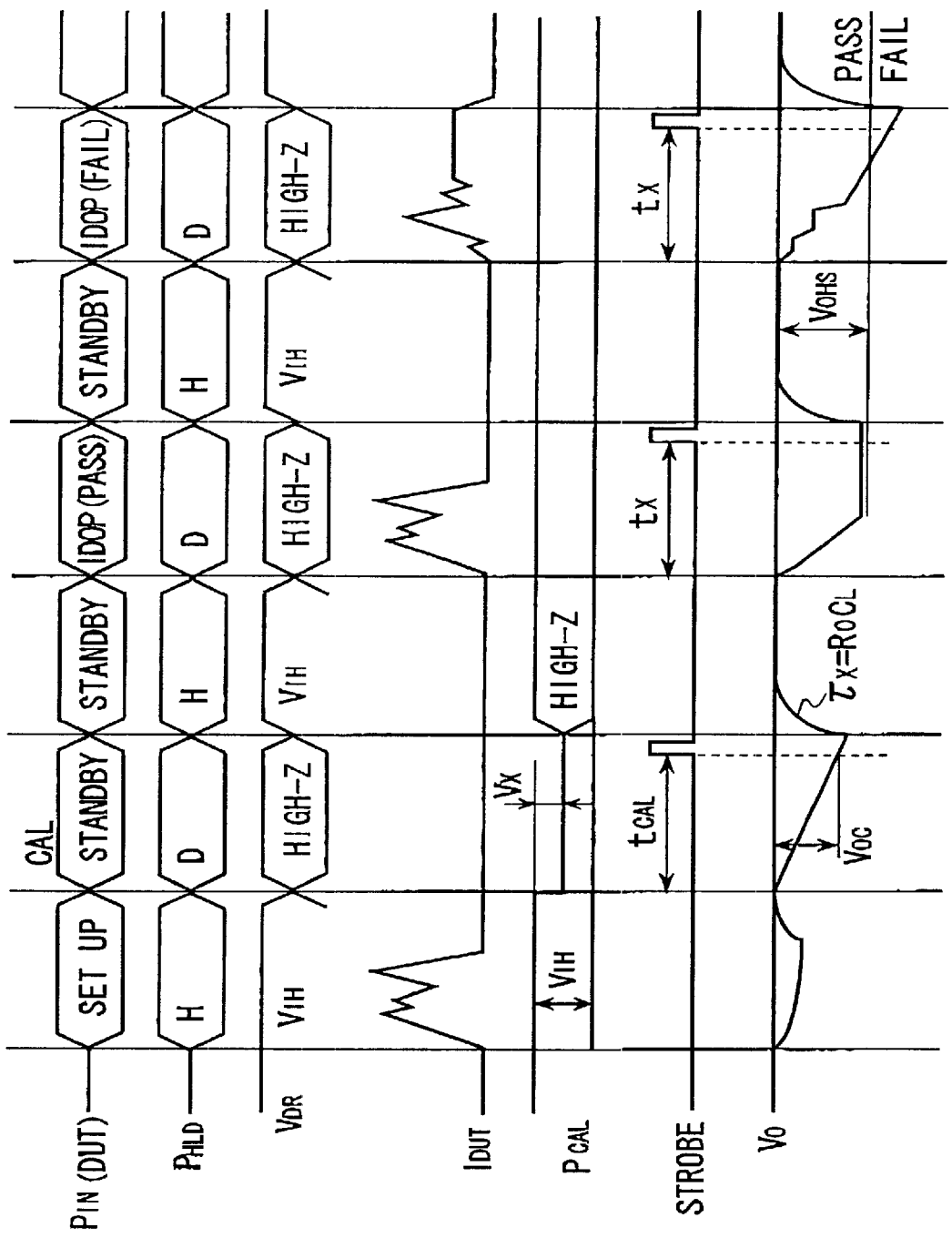
FIG. 8 shows a sequence diagram illustrating another sequence of the current measuring method of the present embodiment.

FIG. 8 shows a sequence diagram of an operation of the current measuring apparatus when using the dummy load circuit 18B shown in FIG. 5(B). The signals, which are identical to the signals of FIG. 7, have the same coding as the signals of FIG. 7, thus the explanations are omitted. In FIG. 8, an output voltage $P_{CAL}$ is set in the dummy load circuit 18B as the predetermined value. The capacitor $C_L$ discharges by reducing the output control voltage of the dummy load circuit 18B after charging the capacitor $C_L$.

If we let the reducing width Vx, for reducing the output voltage of the dummy load circuit 18B for discharging, be 1 V, and let the interior resistance of the driver 34 provided in the dummy load circuit 18B be $R_{02}$=50 Ω, then a current $I_L$=20 mA flows from the capacitor $C_L$. Therefore, the capacitance of the capacitor $C_L$ can be accurately calculated based on the rate of change of the voltage during the discharge, as in the case of using the dummy load circuit 18A shown in the FIG. 5(A). The power supply current of the DUT 20 can be calculated based on the calculated capacity of the capacitor $C_L$ as in the case shown in FIG. 7.

Figure 9:
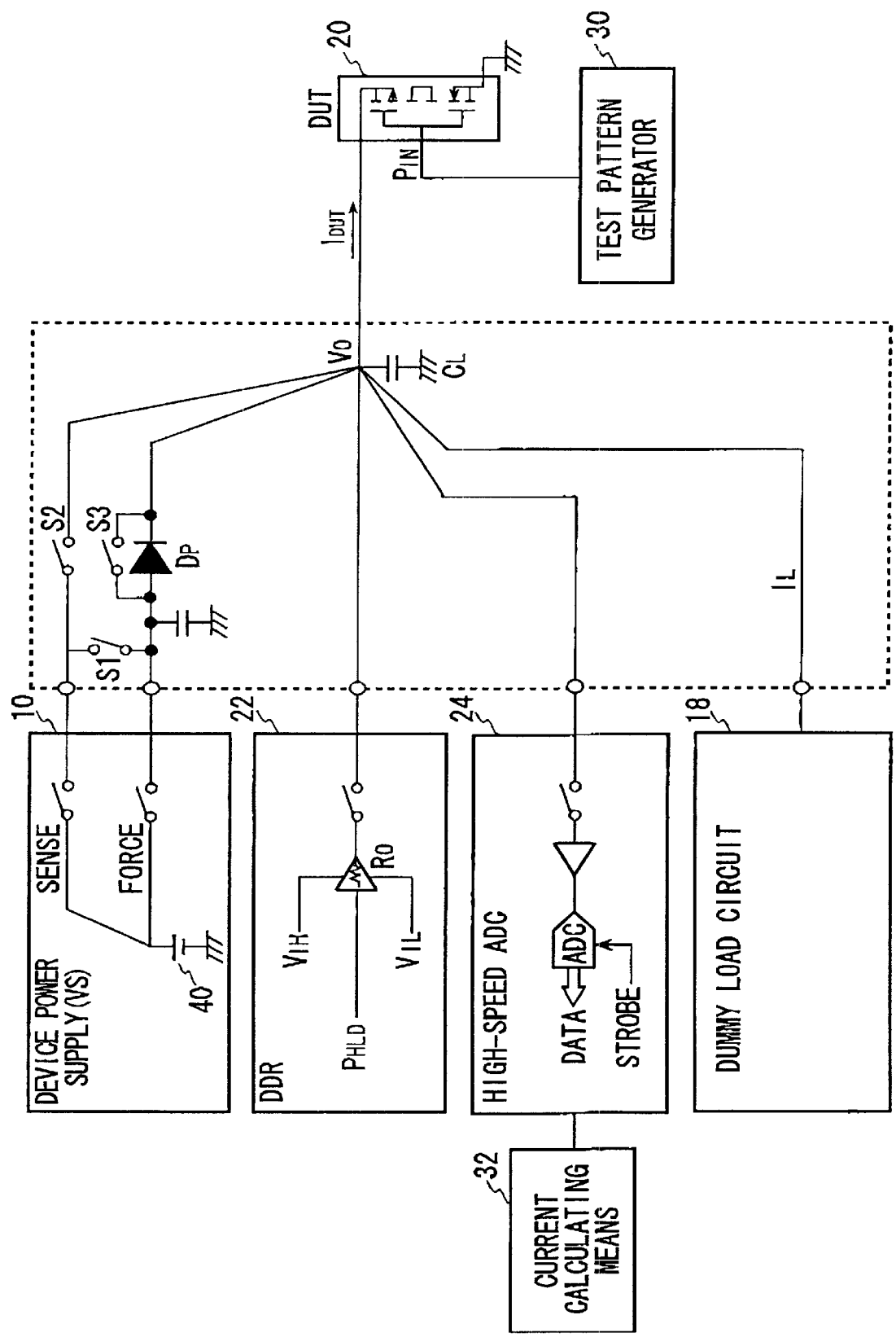
FIG. 9 shows a block diagram of a current measuring apparatus according to another embodiment of the invention.

FIG. 9 shows a block diagram of a current measuring apparatus according to another embodiment of the invention. In the embodiment shown in FIG. 4, the terminal current is measured by inputting the strobe signal to the comparator CP14 periodically and measuring the time taken until the terminal voltage Vo reaches a predetermined value. In other embodiments, a high-speed A/D controller 24 can be provided instead of the comparator CP14. Then, the terminal voltage Vo can be measured after either predetermined time tint or tx has elapsed, by converting the data of the terminal voltage Vo to digital data.

Figure 10:
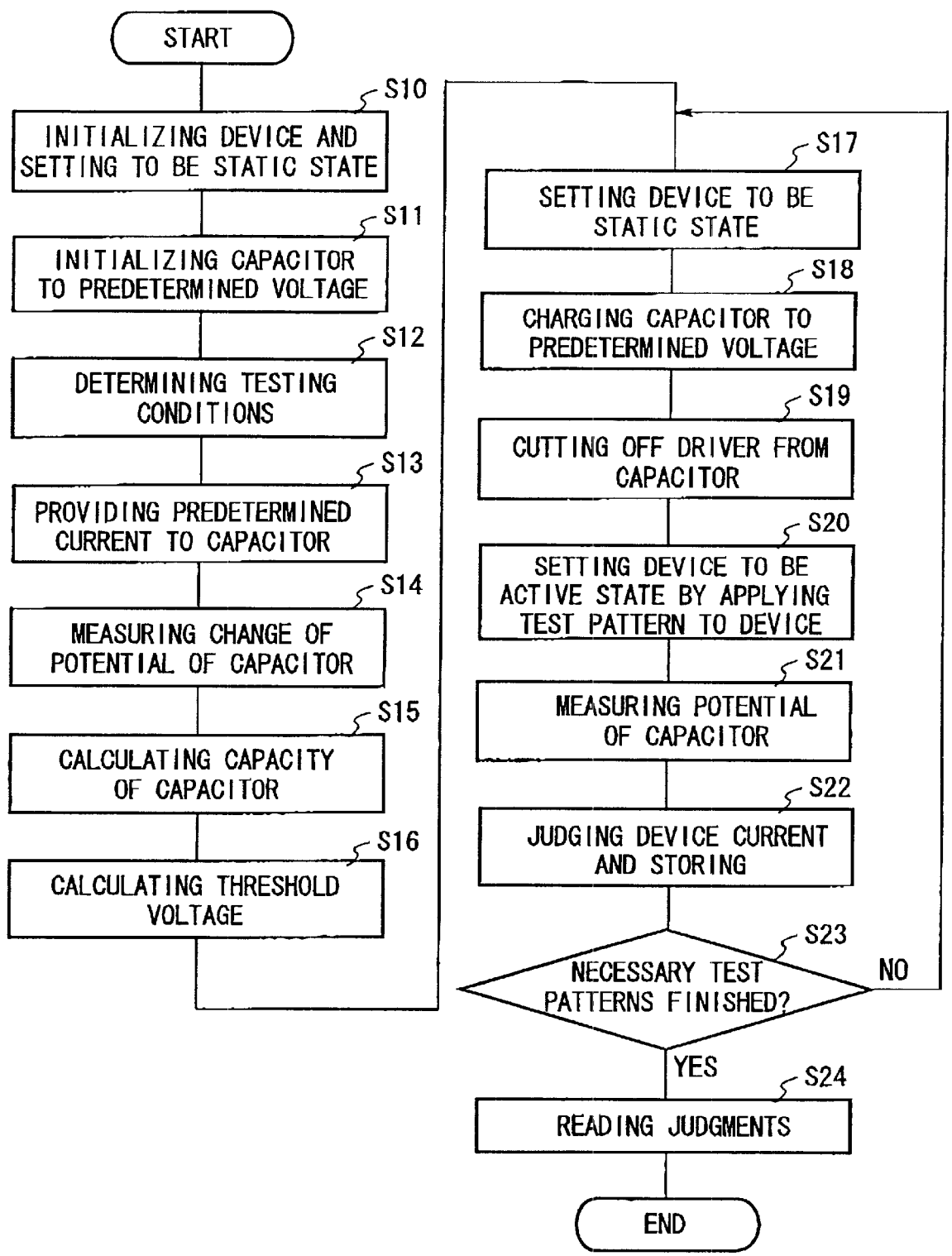
FIG. 10 shows a sequence diagram illustrating the sequence of the current measuring method of the present embodiment.

FIG. 10 shows a flow chart illustrating. the operation of measurement a current generated in the terminal of the DUT using the current measuring apparatus of the present embodiment of the invention. The flow chart of FIG. 10 is similar to that of FIG. 6, and therefore, the same reference numerals are assigned to the same steps. Instead of steps S14 and S21 in FIG. 6, the terminal voltage Vo is measured after. either predetermined time $t_{int}$ (S14') or tx (S21') has elapsed, as described above.

When testing both the capacitance measurement test and the current measurement test of the terminal current at high speed, it is preferable to provide to the current measuring apparatus a bypass circuit, which bypasses the diode Dp. For example, as shown in FIG. 9, switches S1, S2 and S3 are provided. The switch S1 feeds back the output of the power supply VS to the sense input of the power supply VS. The switch S2 cuts off the negative feedback line to the power supply VS. The switch S3 cuts off the bypass of the diode Dp. When measuring the terminal voltage, the switches S1, S2, and S3 are set to be ON, OFF, OFF, respectively. When operating the capacitance measurement test, the switches S1, S2, and S3 are set to be OFF, ON, ON, respectively. Therefore, the current measurement and the capacitance measurement test can be interchanged and carried out at high speed.

When the current of the DUT in the measurement terminal is large, especially when the measurement terminal is a power supply terminal with a large power supply current, the voltage Vo decreases greatly during the operation of the DUT. Therefore, the original power supply current of the DUT cannot be measured accurately. In this case, it is preferable to enlarge the capacity of the capacitor $C_L$. To reduce the time taken for storing the electricity of the capacitor $C_L$ having a large capacity, a plurality of drivers 22 can be provided in parallel. Furthermore, to calibrate the calculation of the capacitor of the capacitor $C_L$ in a condition similar with when the DUT is actually operating, a plurality of the dummy load circuits 18 can be provided in parallel. In this case, by setting each of the operating timings of the plurality of the dummy load circuit 18 independently, the magnitude of the descent of the terminal voltage Vo can be measured for the various waveforms of the current $I_L$.

In the above embodiments, the capacity of the capacitor $C_L$ is calculated beforehand, and the current generated in the measurement terminal of the DUT is measured based on the measured capacity. As in other embodiments, the capacitor $C_L$ is charged to a predetermined voltage beforehand. Then, the operation of the DUT is stopped. The largest current allowable for the measurement terminal of the DUT is output from the dummy load circuit 18 so that the voltage after a predetermined time has elapsed can be measured as the threshold value. In this case, any defects in the DUT can be judged by whether or not the voltage of the capacitor $C_L$ is smaller than the threshold voltage during the actual testing.

As shown in the above embodiments, this invention can accurately measure the current generated in each pin of a device, which is an object of testing.

Although the present invention has been described with reference to specific embodiments, the scope of the present invention is not limited to these embodiments. Those skilled in the art can make various modifications and improvements to these embodiments of the present invention. It is clear from the appended claims that such modifications or improvements are also covered by the scope of the present invention.

What is claimed is:

1. A current measuring method, which measures a device current flowing through a terminal of a semiconductor device, comprising:

charging a capacitor which is connected between said terminal and an earth potential of said semiconductor device, up to a predetermined voltage while said semiconductor device is in static state;

setting said semiconductor device to be in active state by applying a test pattern to said semiconductor device;

measuring a potential of said capacitor at said terminal side after a predetermined test time has elapsed; and judging whether said device current is within a predetermined allowable range, based on said test time, capacitance of said capacitor, and said potential.

2. A current measuring method as claimed in claim 1, further comprising:

initializing said capacitor to a predetermined voltage;

providing a predetermined current to said capacitor;

measuring a change of potential of said capacitor at said terminal side of said semiconductor device after a predetermined time has elapsed; and calculating out said capacitance of said capacitor based on said predetermined current, said predetermined time, and said change of potential.

3. A current measuring method as claimed in claim 1, further comprising:

initializing said capacitor to a predetermined voltage;

providing a predetermined current to said capacitor;

measuring a time taker until a potential of said capacitor at said terminal side of said semiconductor device reaches a predetermined change of potential; and calculating out said capacitance of said capacitor based on said predetermined current, said time, and said change of potential.

4. A current measuring method as claimed in claim 2, wherein said predetermined current is a known constant current.

5. A current measuring method as claimed in claim 3, wherein said predetermined current is a known constant current.

6. A current measuring method as claimed in claim 2, wherein said providing said predetermined current provides a known constant voltage to said capacitor through a known resistance.

7. A current measuring method as claimed in claim 3, wherein said providing said predetermined current provides a known constant voltage to said capacitor through a known resistance.

8. A current measuring method as claimed in claim 1, further comprising:
   calculating out an allowable range of said potential after said test time has elapsed based on largest current allowed into said terminal and said capacitance of said capacitor; and
   judging that said semiconductor device is defective when said potential is out of said allowable range.

9. A current measuring method as claimed in claim 1, further comprising:
   supplementing said terminal with a supplementary current, which supplements said device current, when a potential of said terminal is lower than a predetermined value.

10. A current measuring method as claimed in claim 9, wherein said supplementary current is generated by a constant voltage power supply and supplied to said terminal through a diode.

11. A current measuring apparatus, which measures a device current flowing through a terminal of a semiconductor device, comprising:
    a capacitor connected between said terminal and an earth potential of said semiconductor device;
    a driver for charging said capacitor up to a predetermined voltage while said semiconductor device is in static state;
    a pattern generator for providing a test pattern to said semiconductor device;
    a comparator which measures a potential of said capacitor at said terminal side after a predetermined test time has been elapsed; and
    means for judging whether said device current is within a predetermined allowable range, based on said test time, a capacitance of said capacitor, and said potential.

12. A current measuring apparatus as claimed in claim 11, further comprising:
    a dummy load circuit which provides a predetermined current to said capacitor after setting said capacitor to a predetermined voltage; and
    a means of calculating out said capacity of said capacitor based on a potential at said terminal side, which is measured by said comparator after providing said predetermined current to said capacitor for a predetermined time by said dummy load circuit, and said predetermined current.

13. A current measuring apparatus as claimed in claim 12, wherein said dummy load circuit provides a known constant current to said capacitor.

14. A current measuring apparatus as claimed in claim 12, wherein said dummy load circuit provides a known constant voltage to said capacitor through a known resistance.

15. A current measuring apparatus as claimed in claim 11, further comprising.:
    a means of calculating out an allowable range of said potential after said test time has elapsed based on largest current allowed into said terminal and said capacitance of said capacitor; and
    a means of judging that said semiconductor device is defective when said potential is out of said allowable range.

16. A current measuring apparatus as claimed in claim 11, further comprising a power supply which provides a supplementary current, which supplement said device current, to said terminal when a potential of said terminal is smaller than a predetermined value.

17. A current measuring apparatus as claimed in claim 16, further comprising a diode connecting said power supply and said terminal.

18. A current measuring method according to claim 1, wherein said determining includes calculating out said device current based on said test time, capacitance of said capacitor, and potential.

19. A current measuring apparatus according to claim 1, wherein said means for determining includes means for calculating out said device current based on said test time, capacitance of said capacitor, and said potential.

* * * * *